United States Patent [19]
Paquette

[11] Patent Number: 5,023,672
[45] Date of Patent: Jun. 11, 1991

[54] ELECTROSTATIC DISCHARGE PROTECTION DEVICE FOR GALLIUM ARSENIDE RESIDENT INTEGRATED CIRCUITS

[75] Inventor: Thomas E. Paquette, Colorado Springs, Colo.

[73] Assignee: Ford Microelectronics, Colorado Springs, Colo.

[21] Appl. No.: 437,474

[22] Filed: Nov. 15, 1989

[51] Int. Cl.$^5$ ............................................. H01L 29/48
[52] U.S. Cl. .................... 357/15; 357/23.13; 357/51; 361/91
[58] Field of Search ................ 357/13, 15, 23.13, 51; 361/90, 91, 56

[56] References Cited

U.S. PATENT DOCUMENTS

| | | | |
|---|---|---|---|
| 4,803,527 | 2/1989 | Hatta et al. | 361/56 |
| 4,807,010 | 2/1989 | Winnerl et al. | 357/15 |
| 4,893,159 | 1/1990 | Suzuki et al. | 357/23.13 |
| 4,922,371 | 5/1990 | Gray et al. | 357/23.13 |
| 4,930,036 | 5/1990 | Sitch | 361/56 |

OTHER PUBLICATIONS

Sze, *Semiconductor Devices: Physics and Technology*, 1985, pp. 181-184.

Primary Examiner—Andrew J. James
Assistant Examiner—Courtney A. Bowers
Attorney, Agent, or Firm—Evenson, Wands, Edwards, Lenahan & McKeown

[57] ABSTRACT

A mechanism for effectively preventing damage to a GaAs-resident semiconductor device directs electrostatic charge buildup to a neutralizing source of reference potential by means of a parasitic bypass Schottky circuit that is effectively invisible to normal input signals, but which otherwise provides a current sink discharge path for the unwanted electrostatic charge. The mechanism employs one or more parasitic Schottky diodes formed as a result of the deposition of input/power supply metal on the surface of a semi-insulating GaAs substrate, coupled in series with low resisitivity regions between the input metal and respective power supply terminals.

16 Claims, 3 Drawing Sheets

ELECTROSTATIC DISCHARGE PROTECTION DEVICE FOR GALLIUM ARSENIDE RESIDENT INTEGRATED CIRCUITS

FIELD OF THE INVENTION

The present invention relates in general to semiconductor circuits and is particularly directed to a device for providing electrostatic discharge protection for a GaAs integrated circuit device.

BACKGROUND OF THE INVENTION

Mechanisms for preventing the accumulation of electrostatic charge on integrated circuits, particularly MOS devices, are well documented in the literature. Typically, protection against electrostatic breakdown is accomplished by incorporating some form of threshold sensitive circuit (e.g. breakdown diodes, parasitic transistors) into the (silicon) substrate upstream of the component (e.g. the gate of an FET) to be protected, which serves to shunt what would otherwise be a potentially damaging current spike (caused by electrostatic charge buildup on interconnect metal) through the (resistive) substrate to a reference potential (usually the power supply potentials that are effectively tied off through the substrate).

In a GaAs-resident integrated circuit, however, because the substrate is semi-insulative, the convenience of (large area) current shunting PN junctions in a resistive substrate is not available for discharging electrostatic build-up on (gate) interconnect metal. As a consequence it has become common practice to form a Schottky barrier layer in a portion of the GaAs substrate adjacent to the input metal and tie together the cathode regions, which are spaced apart on opposite sides of the Schottky defining anode region. With the input metal connected to the anode region electrostatic charge is diverted away through the Schottky region. Unfortunately, the current carrying capacity of this approach is relatively small, so that it is not uncommon for a discharge arc to occur between the anode metal and the cathode connection metal. Furthermore, to limit (clamp) the current on the input metal a resistor is often coupled in series with the input metal and the component to be protected. Because of the non-negligible parasitic capacitance of the Schottky regions and the presence of the input clamping resistor, input signals to the circuit now encounter a substantial RC delay penalty, which limits the performance of the circuit.

SUMMARY OF THE INVENTION

In accordance with the present invention there is provided a new and improved mechanism for effectively preventing damage to a GaAs-resident semiconductor device by directing electrostatic charge that builds up on a conductive link, through which electrical inputs to the device are applied, to a neutralizing source of reference potential by means of a parasitic bypass Schottky circuit that is effectively invisible to normal input signals, but which otherwise provides a current sink discharge path for the unwanted electrostatic charge. For this purpose the mechanism employs one or more parasitic Schottky diodes formed as a result of the deposition of input/power supply metal (formed of a metallurgical combination of titanium, platinum and gold) on the surface of a semi-insulating GaAs substrate.

In accordance with a first embodiment of the invention, a parasitic Schottky barrier is formed between a first metallic layer, employed as a signal input link, and a first surface portion of the GaAs substrate. A pair of first and second respective ohmic contact (high impurity concentration semiconductor/cathode) regions are formed at second and third surface portions of the substrate adjacent to, but spaced apart from, the first surface portion (preferably on opposite sides of the first metallic layer). Coupled to the ohmic contact regions are a pair of conductive layers to which respective reference potentials are supplied. That portion of the GaAs substrate between the ohmic contact regions and the parasitic Schottky barrier forms a pair of resistance regions in series with the resistance of the material of the ohmic contact regions, through which respective bias potentials are coupled to spaced apart portions of the Schottky barrier, thereby defining respective shunt circuits each consisting of a parasitic Schottky diode and a resistance in series between the metallic link and a reference potential for removing electrostatic charge away from the input link. To limit the magnitude of the resistance through the GaAs substrate, the separation between the ohmic contact regions and the surface portion of the substrate whereat the input metal forms a parasitic Schottky barrier is preferably less than one micron.

In accordance with a second embodiment of the invention an ohmic contact region is formed in a first surface portion of the GaAs substrate between a signal input link and the metal to the component to be protected. A pair of parasitic Schottky diode regions are formed at second and third surface portions of the substrate adjacent to, but spaced apart from, the first surface portion (on opposite sides of the signal input link). These parasitic Schottky diode regions are defined where a pair of metallic layers, to which respective reference potentials are applied, contact the surface of the substrate at the second and third surface portions. Similar to the first embodiment, that portion of the GaAs substrate between the ohmic contact region and the parasitic Schottky diode regions forms a pair of resistance regions through which the parasitic Schottky diodes are coupled in series between the signal input link and the respective reference potentials, so as to remove electrostatic charge away from the input link.

DETAILED DESCRIPTION

Figure 1:
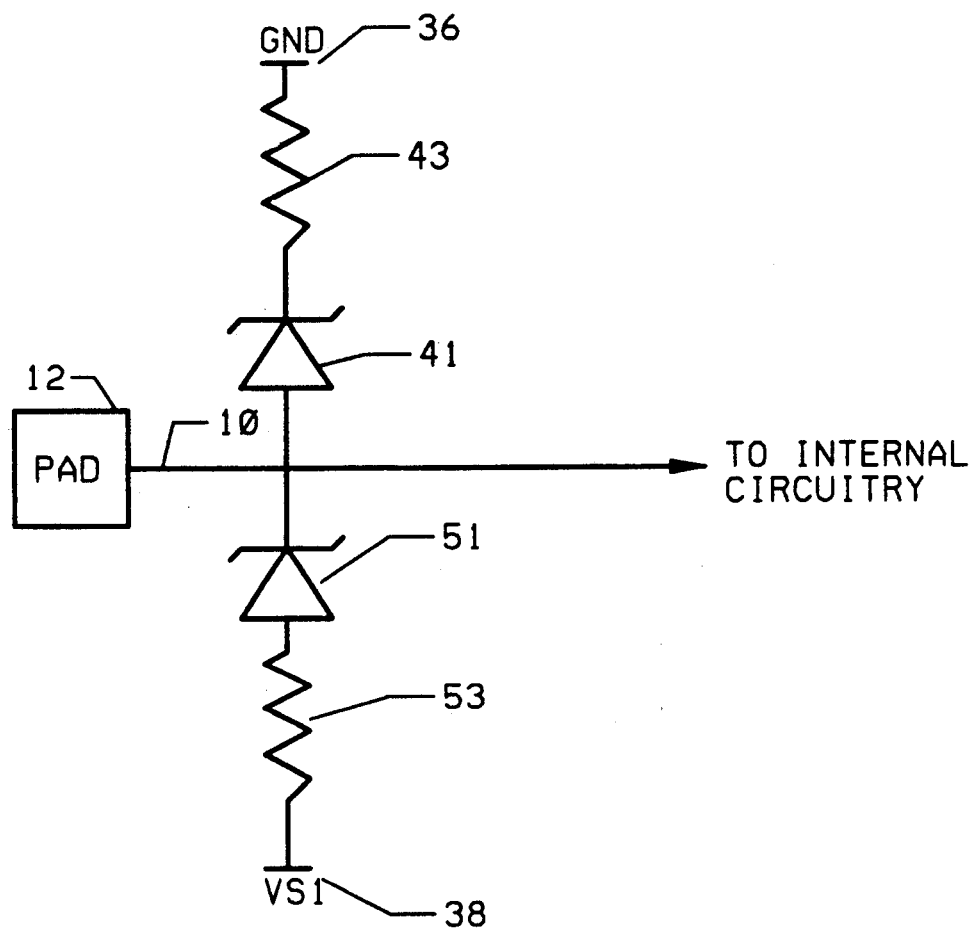
FIGS. 1 and 2 are respective schematic diagrams of GaAs electrostatic discharge protection circuits in accordance with first and second embodiments of the present invention.
Figure 3:
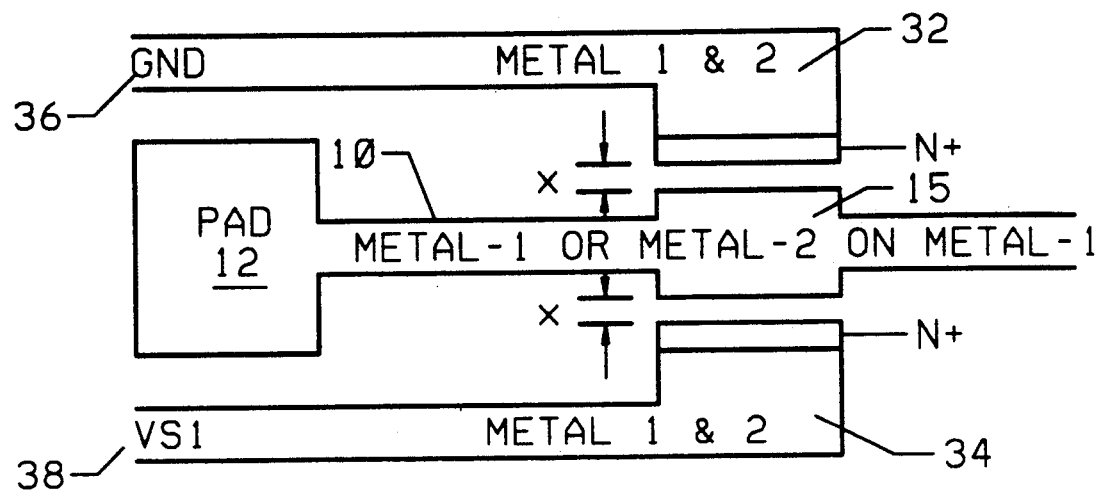
FIGS. 3 and 4 are respective diagrammatic top views of semiconductor device structures to which the schematic circuits of FIGS. 1 and 2 correspond.
Figure 5:
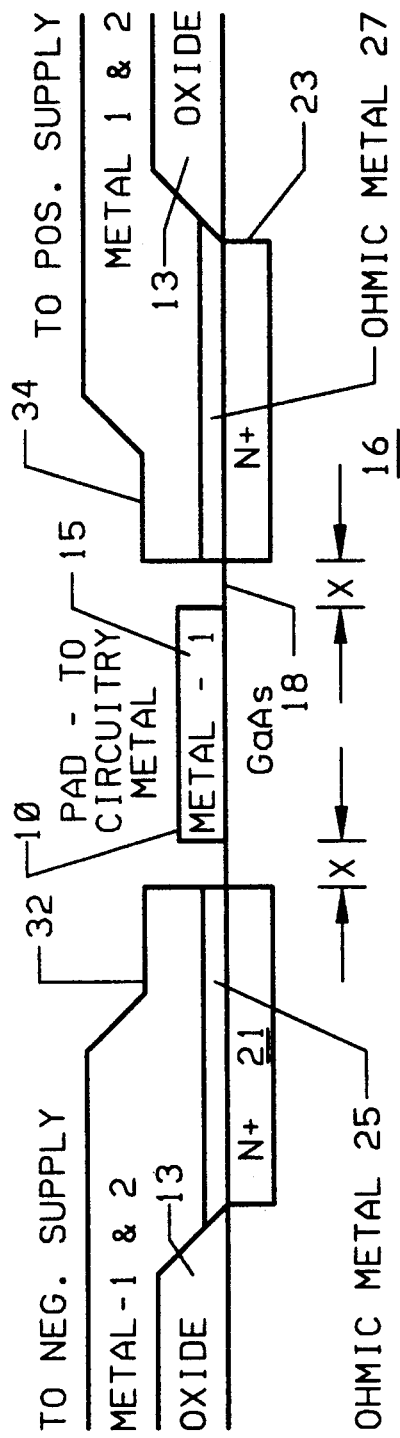
FIGS. 5 and 6 are respective diagrammatic sides views of the device structures illustrated in FIGS. 3 and 4.

Referring now to FIGS. 1, 3 and 5, there is illustrated a first embodiment of the present invention, which incorporates the parasitic Schottky barrier formed between a layer of signal input metal 10 that extends from an input pad 12 and a circuit to be protected (FET gate). Specifically, a signal input pad 12 and a layer of metal 10 which extends from pad 12 to a circuit device to be protected (not shown) may be formed of a common layer of metal that extends over a layer of insulating material 13 disposed on the top surface of a semiconductor (semi-insulating GaAs) substrate 16. Metal layer 10 may be comprised of any commonly employed interconnect metal, such as tungsten, aluminum or metallurgical combination of metals (Ti/Pt/Au) which form a parasitic Schottky barrier with the GaAs (by way of an opening in insulating layer 13).

As shown diagrammatically in the top view of FIG. 3, the width of input metal layer 10 may be increased at a first portion 15 of the surface of substrate 16 whereat a parasitic Schottky diode region 18, that forms part of the protection circuitry of the present invention, is to be formed. Typically the width of metal layer 10 at this first portion 15 is on the order of 2.5 to 4.0 microns; its thickness is preferably on the order of 1.0 microns.

Disposed in respective second and third surface portions of the GaAs substrate, adjacent to, but spaced apart from, first portion 15 of the surface of the GaAs substrate, whereat parasitic Schottky region 18 is defined, are a pair of high impurity concentration N+ ohmic contact/cathode regions 21 and 23. Regions 21 and 23 are formed on opposite sides of parasitic Schottky region 18 by conventional ion implantation and subsequent anneal processing, so as to leave a prescribed substrate separation between parasitic Schottky barrier region 18 and each of regions 21 and 23, as shown in FIGS. 3 and 5. For a semi-insulating substrate of GaAs, having a buld resistivity on the order of $10^7$ ohm-cm, the separation x is preferably between 0.25 and 1 micron.

As shown in FIG. 5, a pair of thin layers 25 and 27 of ohmic contact metal, such as AuGeNi, are formed on portions of each of regions 21 and 23 exposed by respective openings in insulating layer 13. Respective layers 32 and 34 of interconnect metal are formed on the top of insulating layer 13 and extend between respective power supply terminals 36 (ground) and 38 (VS1) (see FIG. 1) and ohmic contact layers 25 and 27. Each of interconnect layers 36 and 38 may comprise the same metal of which input link 10 is formed and an additional overlying layer of interconnect metal (e.g. Au).

As described briefly above and as illustrated schematically in FIG. 1, parasitic Schottky barrier region 18, defined between metal layer 10 and substrate 16, effectively forms a first Schottky diode region 41 coupled in series with a first resistance 43, defined by the material of ohmic contact (N+) region 21 and the semi-insulating GaAs substrate 16, between input metal layer 10 and first reference potential terminal 36 (ground), and a second Schottky diode region 51 coupled in series with a second resistance 53, defined by the material of ohmic contact region 23 and the semi-insulating GaAs substrate 16, between input metal layer 10 and second reference potential terminal 38 (VS1).

In operation, an input signal from input pad 12 and whose magnitude is less than the threshold voltage of parasitic Schottky barrier 18 is coupled over metallic link 10 passing directly to the downstream internal circuit of interest, unaffected by the presence of the parasitic Schottky barrier 18 and resistances 43 and 53. However, larger magnitude (in excess of the threshold potential of Schottky barrier 18) and potentially damaging electrostatic potentials that may accumulate on metallic link 10 are effectively discharged through the parasitic Schottky barrier and its series resistance to either ground or VS1, thereby protecting the downstream circuit.

Figure 2:
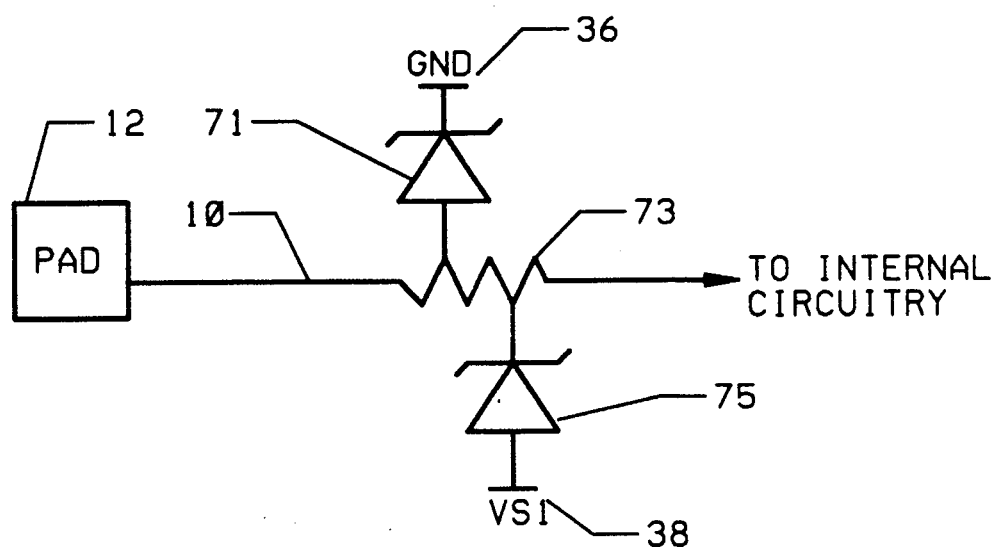
Figure 4:
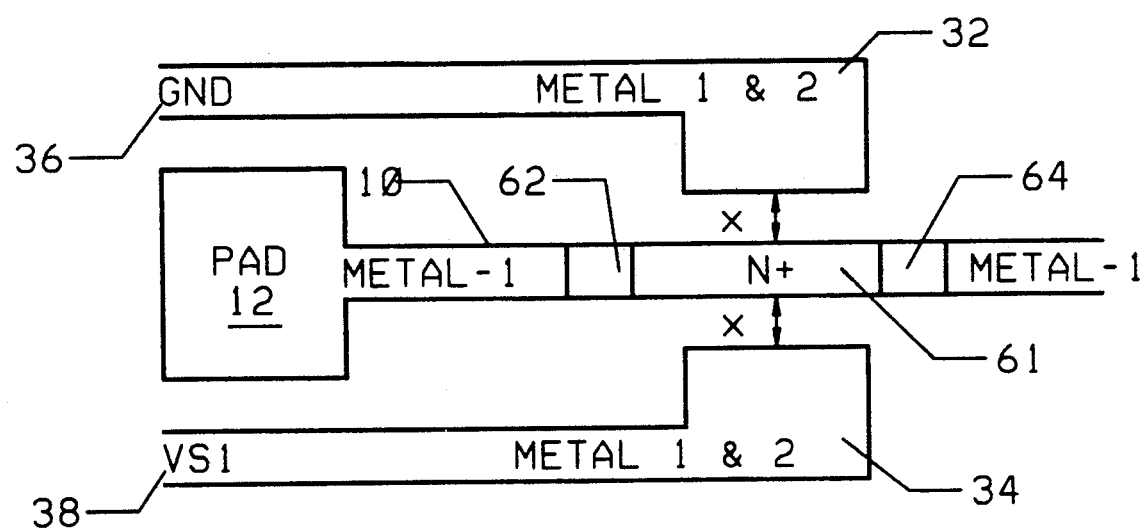
Figure 6:
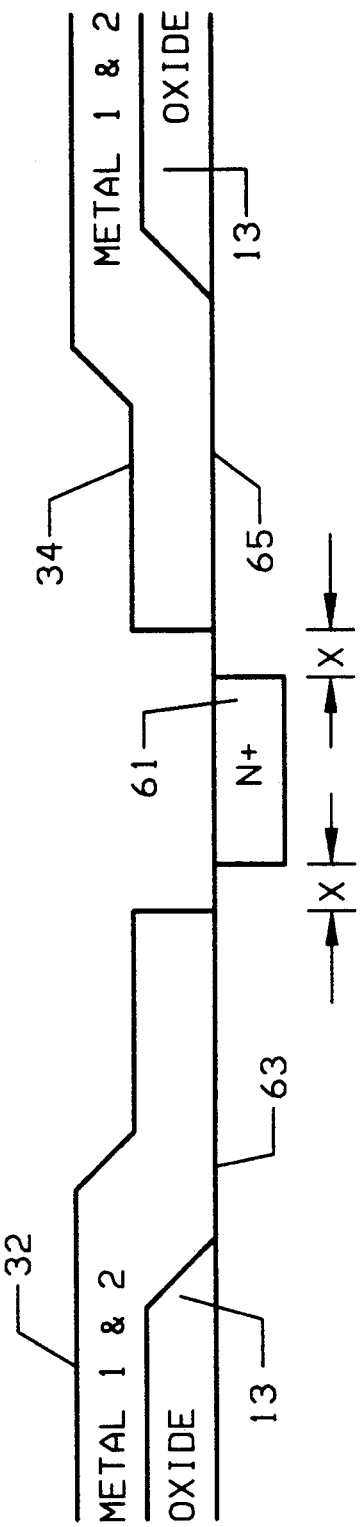

In accordance with a second embodiment of the invention, illustrated in FIGS. 2, 4 and 6, the electrostatic discharge protection circuit incorporates a pair of parasitic Schottky barriers formed between respective layers 32 and 34 of power supply metal that extend from power supply terminals to surface portions of GaAs substrate 16 adjacent to (on opposite sides of) a low resistivity surface region to which the input metal link 10, that connects input pad 12 and the circuit to be protected, is ohmically coupled. Specifically, the metal of which signal input pad 10 and interconnect layer 10 are formed, and which extends over layer 13 of insulating material (e.g. SiO$_2$) disposed on the top surface of GaAs substrate 16, is coupled through an opening in insulator layer 13 into ohmic contact with a first end 62 of a high impurity concentration (low resistivity) N+ region 61 formed in a first surface portion of GaAs substrate 16. Each of parasitic Schottky barrier-defining metal layers 32 and 34 may be comprised of any commonly employed interconnect metal, such as tungsten, aluminum or metallurgical combination of metals (Ti/Pt/Au) which extend through openings in insulator layer 13 and define respective parasitic Schottky barriers 63 and 65, at respective second and third surface portions of substrate 16 adjacent to the first surface portion whereat N+region 61 is formed. As in the first embodiment, for a semi-insulating substrate of GaAs, the separation x between the first surface portion and the second and third surface portions is preferably between 0.25 and 1 micron. Extending from ohmic contact with a second end 64 of N+ region 61 to a downstream circuit is a further portion of input metal 10.

As noted above respective layers 32 and 34 of interconnect metal are formed on the top of insulating layer 13 and extend between respective power supply terminals 36 (ground) and 38 (VS1) and parasitic Schottky barrier defining regions 63 and 65. As in the first embodiment, each of interconnect layers 32 and 34 may comprise the same metal of which input link 10 is formed and an additional overlying layer of interconnect (e.g. Au).

As illustrated schematically in FIG. 2, parasitic Schottky barrier regions 63 and 65, defined between metal layers 32 and 34 substrate 16, effectively form a first diode region 71 coupled in series with a resistance 73, defined by the material of the semi-insulating GaAs substrate 16 and the resistance of N+region 61, between input metal layer 10 and a first reference potential terminal 36 (ground), and a second diode region 75 coupled in series with resistance 73, defined by the material of the semi-insulating substrate 16 and the resistance of N+ region 61, between input metal layer 10 and a second reference potential terminal 38 (VS1).

In operation, input signals are coupled over input metal link 10 through the low resistivity region 61 to a downstream circuit. Because the magnitude of the series resistance 73 imparted by N+ region 61 is relatively low, the signals are not substantially affected. However, when the magnitude of an electrostatic charge build-up on link 10 exceeds the threshold of a parasitic Schottky barrier, potential damaging electrostatic potentials are effectively discharged to either ground or VS1, thereby protecting the downstream circuit. Thus, as in the case of the first embodiment of the invention, described above, for normal signal inputs the parasitic Schottky protection circuit remains effectively inoperative and does not detrimentally impact the characteristics of the signals as they are coupled to the downstream circuit. However, in response to the potential of an electrostatic charge build-up on input metal 10 exceeding the threshold voltage of a parasitic Schottky barrier of the protection circuit, a shunting current flow path is provided from the input metal to one of a pair of reference potentials to thereby prevent damage to the downstream circuit.

In each of the above-described embodiments of the present invention, the exact process through which the respective N+ regions and metallic layers are formed is not critical and may employ conventional selective etch, implant, anneal and metallization steps typically used in the processing of GaAs integrated circuits. Moreover tayloring of the characteristics of the series circuits of Schottky diodes and substrate resistance may be effected by controlled proton bombardment of the surface of the substrate so as to alter substrate resistance.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor device for effectively directing electrostatic charge away from a semiconductor circuit, formed within a semiconductor substrate of semi-insulating material and having a conductive link through which electrical signal inputs to said semiconductor circuit are applied and by way of which said electrostatic charge may be coupled to said semiconductor circuit, comprising:
   a first metallic layer contacting a first surface portion of the semi-insulating material of said semiconductor substrate adjacent to said conductive link and forming a first Schottky barrier with said first surface portion of the semi-insulating material of said substrate;
   a first ohmic contact region formed in second surface portion of said substrate adjacent to but spaced apart from said first surface portion of the semi-insulating material of said substrate;
   first means for coupling one of said first metallic layer and first ohmic contact region to said conductive link; and
   second means for coupling the other of said first metallic layer and said first ohmic contact region to a first source of reference potential;
   said conductive link through which electrical signal inputs are applied to said semiconductor circuit being exclusive of any reference potential applied to said substrate;
   a first series circuit of said first Schottky barrier and a first resistance, corresponding to semiconductor material of said first ohmic contact region and semi-insulating material of said substrate between said first ohmic contact region and said first Schottky barrier, existing between said conductive link and said first source of reference potential and providing a first path for effectively removing electrostatic charge from said conductive link.

2. A semiconductor device according to claim 1, wherein said first means comprises means for coupling said first metallic layer to said conductive link and said second means comprises means for coupling said first ohmic contact region to said first source of reference potential.

3. A semiconductor device according to claim 2, further including a second ohmic contact region defined at a third surface portion of said semiconductor substrate adjacent to but spaced apart from said first surface portion of the semi-insulating material of said substrate, and third means for coupling said second ohmic contact region to a second source of reference potential, a second series circuit of said first Schottky barrier and a second resistance, corresponding to semiconductor material of said second ohmic contact region and semi-insulating material of said substrate between said second ohmic contact region and said first Schottky barrier, existing between said conductive link and said second source of reference potential and providing a second path for effectively removing electrostatic charge from said conductive link.

4. A semiconductor device according to claim 2, wherein said second means comprises a conductive layer disposed in ohmic contact with said first ohmic contact region and being coupled to said first source of reference potential.

5. A semiconductor device according to claim 3, wherein each of said second and third means comprises a respective conductive layer disposed in ohmic contact with said first and second ohmic contact regions and being coupled to said first and second sources of reference potential.

6. A semiconductor device according to claim 1, wherein said semiconductor substrate comprises a GaAs substrate and the separation between said first and second portions of said GaAs substrate is between 0.25 and 1 micron.

7. A semiconductor device according to claim 5, wherein said semiconductor substrate comprises a GaAs substrate and said conductive link comprises said first metallic layer formed on the semi-insulating GaAs material of said GaAs substrate contacting said first surface portion thereof so as to form said first Schottky barrier therewith.

8. A semiconductor device according to claim 7, wherein each of said first and second ohmic contact regions is formed of a respective high impurity concentration semiconductor region.

9. A semiconductor device according to claim 8, wherein said first metallic layer is metallurgically comprised of titanium, platinum and gold.

10. A semiconductor device according to claim 1, wherein said first means comprises means for coupling said first ohmic contact region to said conductive link and said second means comprises means for coupling said first metallic layer to said source of reference potential.

11. A semiconductor device according to claim 10, further including a second metallic layer contacting a third surface portion of the semi-insulating material of said semiconductor substrate adjacent to but spaced apart from said second surface portion of said substrate and forming with said third surface portion of the semi-insulating material of said substrate a second Schottky barrier; and
   third means for coupling said second metallic layer to a second source of reference potential, a second series circuit of said second Schottky barrier and a second resistance, corresponding to semiconductor material of said first ohmic contact region and semi-insulating material of said substrate between said first ohmic contact region and said second Schottky barrier, existing between said conductive link and said second source of reference potential and providing a second path for effectively removing electrostatic charge from said conductive link.

12. A semiconductor device according to claim 11, wherein each of said second and third means comprises a respective metallic layer disposed in contact with said first and third surface portions of the semi-insulating material of said substrate, respectively, so as to form said first and second Schottky barriers therewith and being coupled to said first and second sources of reference potential, respectively.

13. A semiconductor device according to claim 12, wherein said semiconductor substrate comprises a GaAs substrate and the separation between said second surface portion and said first and third surface portions of said GaAs substrate is between 0.25 and 1 micron.

14. A semiconductor device according to claim 12, wherein said semiconductor substrate comprises a GaAs substrate and said conductive link comprises a conductive layer overlying said GaAs substrate and being in ohmic contact said first ohmic contact region formed in said second surface portion.

15. A semiconductor device according to claim 14, wherein said first ohmic contact region is formed of a high impurity concentration semiconductor region.

16. A semiconductor device according to claim 15, wherein each of said first and second metallic layers is metallurgically comprised of titanium, platinum and gold.

* * * * *